United States Patent
Suzuki et al.

(10) Patent No.: US 6,796,027 B2
(45) Date of Patent: Sep. 28, 2004

(54) METHOD OF MANUFACTURING PRINTED WIRING BOARD

(75) Inventors: Toshiyuki Suzuki, Nara (JP); Kazuya Nakagawa, Matsuzaka (JP); Mitsuru Kobayashi, Agei-gun (JP); Eiji Shiohama, Katano (JP); Masaru Sugimoto, Osaka (JP); Hideyoshi Kimura, Hirakata (JP); Takuma Hashimoto, Yawata (JP)

(73) Assignee: Matsushita Electric Works, Ltd., Kadoma (JP)

( * ) Notice: Subject to any disclaimer, the term of this patent is extended or adjusted under 35 U.S.C. 154(b) by 108 days.

(21) Appl. No.: 10/146,800

(22) Filed: May 17, 2002

(65) Prior Publication Data

US 2002/0172019 A1 Nov. 21, 2002

(30) Foreign Application Priority Data

May 21, 2001 (JP) .................................. 2001-151382
May 21, 2001 (JP) .................................. 2001-151383

(51) Int. Cl.$^7$ ................................................ H05K 3/10
(52) U.S. Cl. ......................... 29/846; 29/825; 29/874; 29/884
(58) Field of Search .......................... 29/825, 846, 852, 29/874, 884, 833, 832

(56) References Cited

U.S. PATENT DOCUMENTS 3,491,197 A * 1/1970 Walkow ...................... 174/254
3,601,522 A * 8/1971 Lynch ......................... 174/254
4,604,799 A   8/1986 Gurol
4,861,640 A   8/1989 Gurol
4,985,116 A   1/1991 Mettler et al.
5,494,781 A   2/1996 Ohtani et al.
5,736,191 A * 4/1998 Biernath ....................... 427/96
5,834,833 A * 11/1998 Nagafuji ..................... 257/678
5,896,655 A * 4/1999 Knodler ....................... 29/884

FOREIGN PATENT DOCUMENTS

DE    3843230    * 9/1989
EP    03183190   * 8/1991
EP    09172133   * 6/1997
GB    1581595    * 12/1980

* cited by examiner

*Primary Examiner*—Carl J. Arbes
(74) *Attorney, Agent, or Firm*—Oblon, Spivak, McClelland, Maier & Neustadt, P.C.

(57) ABSTRACT

A method of efficiently manufacturing a printed wiring board is provided. In this method, a metal thin film is formed on a substrate having a projection. Then, an initial circuit pattern is formed on the substrate by patterning the metal thin film. The initial circuit pattern comprises first and second circuit patterns isolated from each other and a conductive layer formed on the projection to make a temporary electrical connection between the first and second circuit patterns. Electroplating is performed by the passage of electric current through the initial circuit pattern to form an additional metal film on the initial circuit pattern. After the electroplating, the conductive layer on the projection is removed to provide electrical insulation between the first and second circuit patterns.

17 Claims, 8 Drawing Sheets

METHOD OF MANUFACTURING PRINTED WIRING BOARD

BACKGROUND OF THE INVENTION

1. Field of the Invention

The present invention relates to a method of manufacturing a printed wiring board comprising the step of efficiently forming a metal film by electroplating to provide a plurality of circuit patterns isolated from each other on a substrate.

2. Disclosure of the Prior Art

In a conventional method of manufacturing printed wiring boards, a metal thin film is first formed on a substrate, and required regions of the metal thin film are removed by using a laser beam to form patterns of the metal thin film on the substrate. Then, electroplating is performed to form an additional metal film on the patterns of the metal thin film, so that the circuit patterns having an increased thickness is obtained on the substrate.

Figure 20:
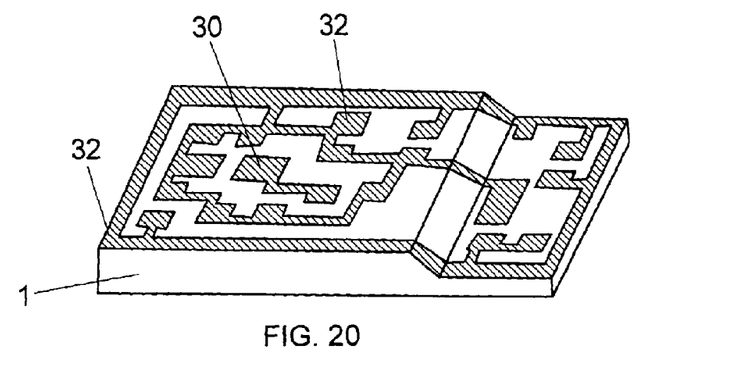
FIG. 20 is a perspective view of a printed wiring board with circuit patterns isolated from each other.

However, when the patterns of the metal thin film on the substrate are electrically isolated from each other, the electroplating step becomes very complicated. For example, when a circuit pattern 30 is electrically insulated from the circuit pattern 32, as shown in FIG. 20, it is required to individually perform electroplating with respect to each of these isolated circuit patterns to form addition metal films thereon. As a result, an increase in production cost is caused by an extension of time required for the electroplating step. In addition, a quality of the plating solution must be very often checked.

On the other hand, by providing a feeder circuit for electroplating to each of the isolated circuit patterns, it is possible to form the additional films on the isolated circuit patterns at a time by electroplating. However, in this method, there is a limitation in manufacturing printed wiring boards with high-density circuit patterns. That is, as the density of circuit patterns is higher, a reliability of the circuit patterns formed by electroplating deteriorates.

To eliminate the above-described inconveniences, U.S. Pat. No. 5,494,781 discloses an improved method of manufacturing a printed wiring board. According to this method, it is possible to simultaneously form the additional metal films on the isolated circuit patterns by electroplating without supplying electric current to the isolated circuit patterns through the feeder circuits.

Figure 21A:
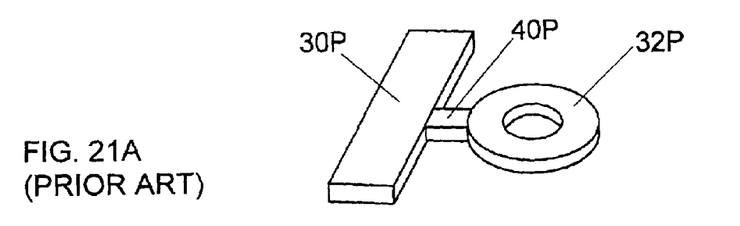
FIGS. 21A to 21C are schematic perspective views showing a method of manufacturing a printed wiring board disclosed in U.S. Pat. No. 5,494,781.
Figure 21B:
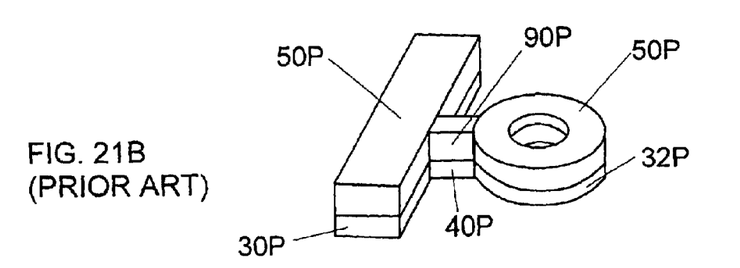
Figure 21C:
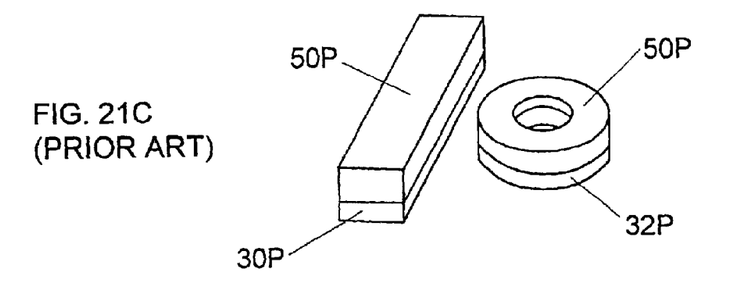

That is, as shown in FIG. 21A, by pattering a metal thin film formed on the substrate, circuit patterns (30P, 32P) isolated from each other and a conductive layer 40P extending therebetween are provided on the substrate. After a resist film 90P is formed on the conductive layer 40P, electroplating is performed by the passage of electric current through the isolated circuit patterns (30P, 32P) connected by the conductive layer 40P to simultaneously form an additional metal film 50P on these circuit patterns, as shown in FIG. 21B. At this time, since the conductive layer 40P is covered with the resist film 90P, the additional film 50P is not formed on the conductive layer. After the electroplating, the resist film 90P is removed to expose the conductive layer 40P, and the conductive layer 40P is removed by soft etching to make an electrical insulation between the isolated circuit patterns (30P, 32P), as shown in FIG. 21C.

However, since the step of forming the resist film 90P on the conductive layer 40P is needed, it leads to an increase in production cost. In particular, when forming a three-dimensional circuit pattern on a substrate for MID (molded interconnect device), or manufacturing a high-density printed wiring board, the difficulty of forming the resist film on the conductive layer comes into a problem. In addition, when the removal of the conductive layer 40P after the electroplating is not enough, there is a fear that insulation failure occurs.

SUMMARY OF THE INVENTION

Therefore, a concern of the present invention is to provide a method of manufacturing a printed wiring board, which is characterized in that a metal film can be formed on the circuit patterns at a time by electroplating without the formation of a resist film on a conductive layer extending between circuit patterns isolated from each other, and after the electroplating the conductive layer can be easily removed with reliability to provide electrical insulation between the circuit patterns. That is, the method of the present invention comprises the steps of:

providing a substrate with at least one of a projection and a concave;

forming a first circuit pattern on the substrate;

forming a second circuit pattern isolated from the first circuit pattern on the substrate;

wherein when the substrate has the projection, the method comprises the steps of:

forming a first conductive layer on the projection to make a temporary electrical connection between the first and second circuit patterns;

performing electroplating by the passage of electric current through the first and second circuit patterns connected by the first conductive layer to simultaneously form a metal film on the first and second circuit patterns; and after the electroplating, removing the first conductive layer on the projection to provide electrical insulation between the first and second circuit patterns;

wherein when the substrate has the concave, the method comprises the steps of:

covering the concave with a material different from the substrate to obtain a cover portion;

forming a second conductive layer on the cover portion to make a temporary electrical connection between the first and second circuit patterns;

performing electroplating by the passage of electric current through the first and second circuit patterns connected by the second conductive layer to simultaneously form a metal film on the first and second circuit patterns; and after the electroplating, removing the second conductive layer on the cover portion to provide electrical insulation between the first and second circuit patterns.

It is preferred that substrate with at least one of the projection and the concave is formed by means of integral molding.

It is also preferred that the substrate has a plurality of projections, which are formed such that tops of the projections are substantially flush with each other.

To improve manufacturing efficiency, it is particularly preferred that the first circuit pattern, the second circuit pattern and the first conductive layer are provided at a time by patterning a metal thin film formed on the substrate. Similarly, when the substrate has the concave, it is preferred that the first circuit pattern, the second circuit pattern and the second conductive layer are provided at a time by patterning a metal thin film formed on the substrate after the concave is covered with the material.

In addition, the present invention presents a method of more efficiently manufacturing the printed circuit board. That is, the method comprises:

forming a metal thin film on a substrate having a projection;

providing an initial circuit pattern on the substrate by patterning the metal thin film, the initial circuit pattern comprising first and second circuit patterns isolated from each other and a conductive layer formed on the projection to make a temporary electrical connection between the first and second circuit patterns;

performing electroplating by the passage of electric current through the initial circuit pattern to form an additional metal film on the initial circuit pattern; and after the electroplating, removing the conductive layer on the projection to provide electrical insulation between the first and second circuit patterns.

In particular, when it is required to form three-dimensional circuit patterns on a substrate for MID or manufacture a high-density printed wiring board, it is preferred to use the following method of manufacturing a printed wiring board.

That is the method of the present invention comprises the steps of:

providing a substrate with a first surface having a first projection and a second surface extending at a different level from the first surface and having a second projection thereon;

forming a first circuit pattern on the first surface;

forming a second circuit pattern isolated from the first circuit pattern on the second surface;

forming a third circuit pattern isolated from the first and second circuit patterns so as to extend from the first surface to the second surface;

forming a first conductive layer on the first projection to make a temporary electrical connection between the first and third circuit patterns;

forming a second conductive layer on the second projection to make a temporary electrical connection between the second and third circuit patterns;

performing electroplating by the passage of electric current through the first, second and third circuit patterns connected by the first and second conductive layers to simultaneously form a metal film on the first, second and third circuit patterns; and after the electroplating, removing the first and second conductive layers on the first and second projections to provide electrical insulation among the first, second and third circuit patterns.

In the above method, it is preferred that the first and second projections are formed that a top of the first projection is substantially flush with the top of the second projection, and the first and second conductive layers on the first and second projections are removed at a time.

Another concern of the present invention is to provide a substrate used in the method of the present invention, and having at least one of a projection and a concave, which is adapted to form a conductive layer for making a temporary electrical connection between circuit patterns isolated from each other on the substrate, in order to simultaneously form a metal film on the circuit patterns connected by the conductive layer by electroplating.

In particular, it is preferred that the substrate is provided with a first surface having a first projection and a second surface extending at a different level from the first surface and having a second projection formed such that a top of the first projection is substantially flush with the top of the second projection, and wherein each of the first and second projections is adapted to form a conductive layer for making a temporary electrical connection between circuit patterns isolated from each other on the substrate, in order to simultaneously form a metal film on the circuit patterns connected by the conductive layer by electroplating.

These and still other objects and advantages of the present invention will become more apparent from preferred embodiments of the present invention explained in detail below, referring to the attached drawings.

The present disclosure relates to subject matters contained in Japanese Patent applications No. 2001-151382 and No. 2001-151383, which were filed on May 21, 2001, the disclosure of which is expressly incorporated herein by reference in its entirety.

PREFERRED EMBODIMENTS OF THE INVENTION

A method of manufacturing a printed wiring board of the present invention is explained in detail below according to preferred embodiments.

First Embodiment

Figure 1A:
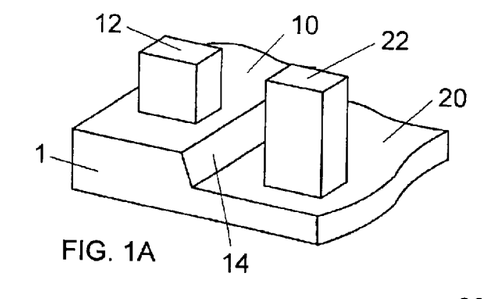
FIGS. 1A and 1B are schematic perspective and cross-sectional views of a substrate used in a method of manufacturing a printed wiring board according to a first embodiment of the present invention.
Figure 1B:
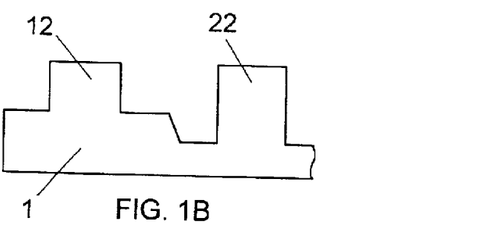

A substrate used in the first embodiment is shown in FIG. 1A. The substrate 1 is provided with a first surface 10 having a first projection 12, a second surface 20 having a second projection 22, and an oblique surface 14 extending between the first and second surfaces. Therefore, the second surface extends at a different level from the first surface. As shown in FIG. 1B, heights of the first and second projections (12, 22) are determined such that a top of the first projection 12 is substantially flush with the top of the second projection 22. It is preferred that those projections are integrally formed with the substrate 1 by means of injection molding.

Figure 2A:
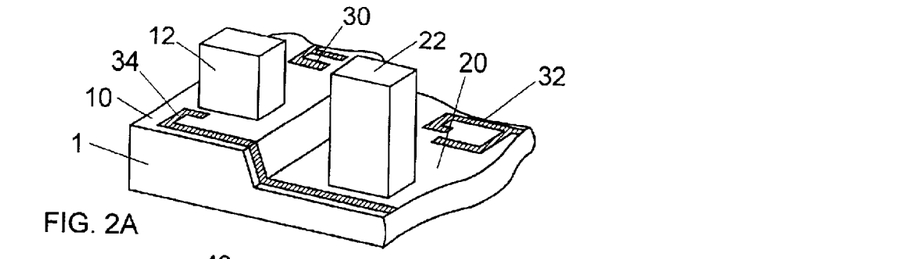
FIGS. 2A to 2D are schematic perspective views showing the method according to the first embodiment of the present invention.
Figure 2B:
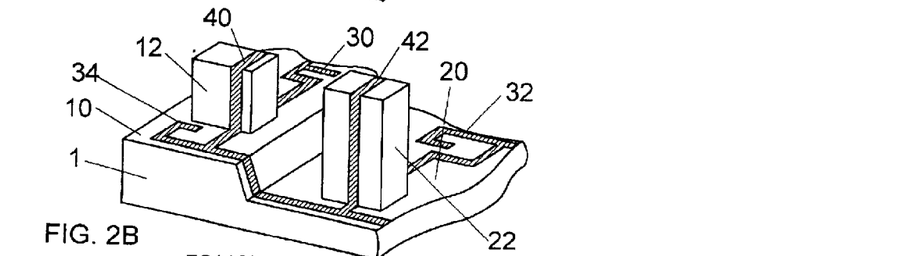

As shown in FIG. 2A, first and second circuit patterns (30, 32) isolated from each other are respectively formed on the first and second surfaces (10, 20) of the substrate 1. In addition, a third circuit pattern 34 isolated from the first and second circuit patterns (30, 32) is formed to extend from the first surface 10 to the second surface 20 through the oblique surface 14. Then, as shown in FIG. 2B, a first conductive layer 40 is formed on the first projection 12 to make a temporary electrical connection between the first and third circuit patterns (30, 34), and similarly a second conductive layer 42 is formed on the second projection 22 to make a temporary electrical connection between the second and third circuit patterns (32, 34). The first and second conductive layers (40, 42) are used only in a step of electroplating described below.

Figure 2C:
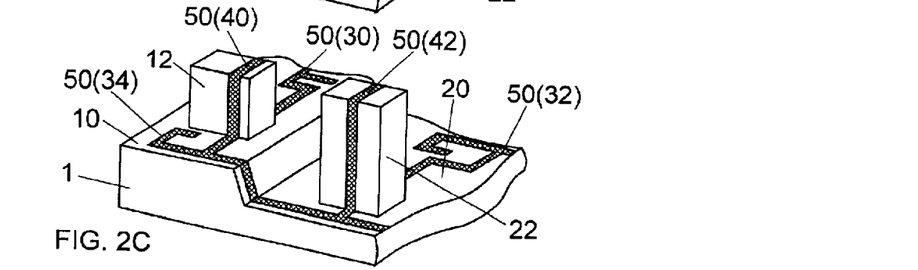
Figure 2D:
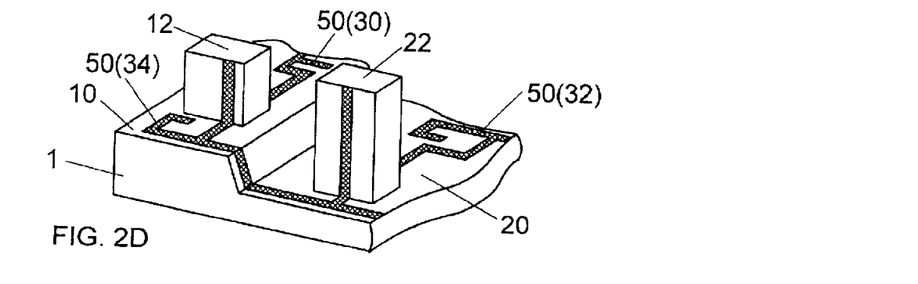

Next, as shown in FIG. 2C, electroplating such as copper electroplating is performed by the passage of electric current through the first, second and third circuit patterns (30, 32, 34) connected by the first and second conductive layers (40, 42) to simultaneously form an additional metal (copper) film 50 having a desired thickness on those circuit patterns. For example, when the electric current is supplied to the third circuit pattern 34, it flows to the first circuit pattern 30 through the first conductive layer 40 on the first projection 12, and at the same time flows to the second circuit pattern 32 through the second conductive layer 42 on the second projection 22, After the electroplating, the additional metal film 50 and the first and second conductive layers (40, 42) on the first and second projections (12, 22) are removed to provide electrical insulation among the first, second and third circuit patterns (30, 32, 34), as shown in FIG. 2D.

Figure 3A:
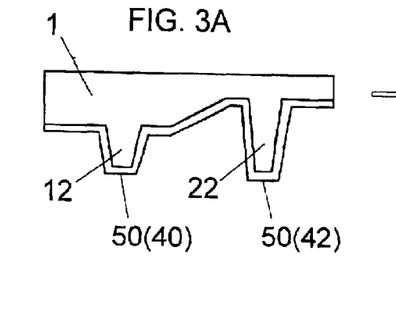
FIGS. 3A to 3C are schematic cross-sectional views showing a step of removing a conductive layer by chemical etching in the method of the first embodiment.
Figure 3B:
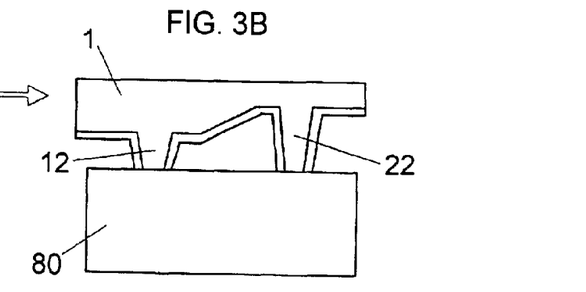
Figure 3C:
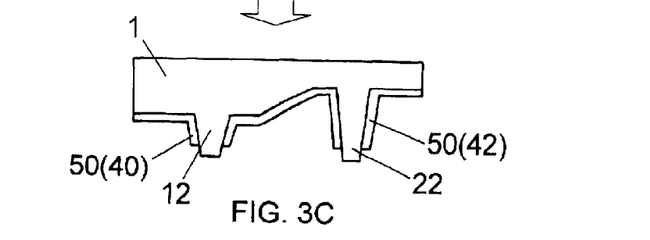

For example, it is preferred to remove those conductive layers (40, 42) and the additional metal film 50 by means of chemical etching. In this case, there is an advantage of preventing the occurrence of mechanical damages to the substrate 1 or the circuit patterns (30, 32, 34). In particular, as shown in FIGS. 3A to 3C, when the top of the first projection 12 is substantially flush with the top of the second projection 22, it is possible to simultaneously remove the conductive layers (40, 42) by dipping only the tops of those projections (12, 22) in an etching solution 80. This presents further improvement in the manufacturing efficiency.

Alternatively, those conductive layers (40, 42) and the additional metal film 50 may be mechanically removed by grinding or cutting. For example, when removing the respective conductive layer (40, 42) together with at least a part of the corresponding projection (12, 22) from the substrate 1, there is an advantage of providing the electrical insulation between the circuit patterns with reliability without short circuit resulting from a residue of the conductive layer on the top of the projection. In addition, when the top of the first projection 12 is substantially flush with the top of the second projection 22, the conductive layers (12, 22) can be removed at a time by cutting the projections at a constant cutting depth with a grinding wheel. Therefore, the working efficiency is remarkably improved, as compared with the case of individually determining an optimum cutting depth of the grinding wheel with respect to each of the projections.

In the above method, to improve manufacturing efficiency, it is particularly preferred that the formation of the first, second and third circuit patterns (30, 32, 34) and the formation of the first and second conductive layers (40, 42) are performed at a time. That is, a metal thin film is formed first on the substrate 1 having first and second projection (12, 22). Then an initial circuit pattern is formed on the substrate by patterning the metal thin film. The initial circuit pattern comprising the first, second and third circuit patterns (30, 32, 34) isolated from each other, the first conductive layer 40 formed on the projection 12 to make the electrical connection between the first and third circuit patterns (30, 34) and the second conductive layer 42 formed on the projection 22 to make the electrical connection between the second and third circuit patterns (32, 34). Subsequently, electroplating is performed by the passage of electric current through the initial circuit pattern to form an additional metal film 50 on the initial circuit pattern. After the electroplating, the conductive layers (40, 42) on the projections are removed to provide electrical insulation among those circuit patterns. As the patterning method, it is preferred that required regions of the metal thin film are removed by irradiating a laser beam along a predetermined pattern. According to this method, it is possible to efficiently form a high-density pattern of the metal thin film with accuracy.

In this embodiment, as shown in FIG. 2A, the first, second and third circuit patterns (30, 32, 34) are formed on the substrate 1. However, if necessary, an additional circuit pattern(s) may be formed on the substrate. When forming such an additional circuit pattern, the substrate may have at least one surface that extends at a different level from the first and second surfaces. In this case, it is preferred that additional projections are formed on the surfaces other than the first and second surfaces (10, 20) so as to be substantially flush with the first and second projections (12, 22).

Figure 4A:
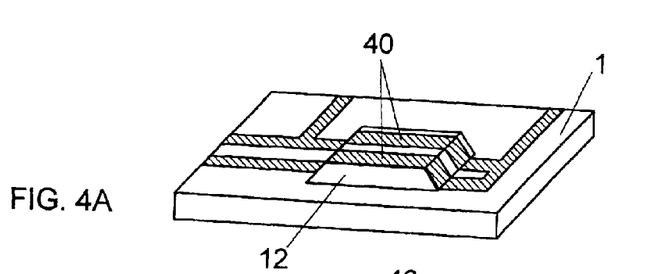
FIGS. 4A to 4C are schematic perspective views of patterns of the conductive layer formed on a projection of the substrate.
Figure 4B:
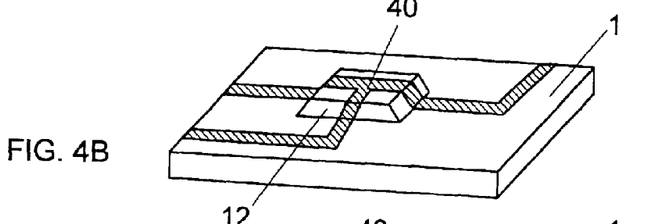
Figure 4C:
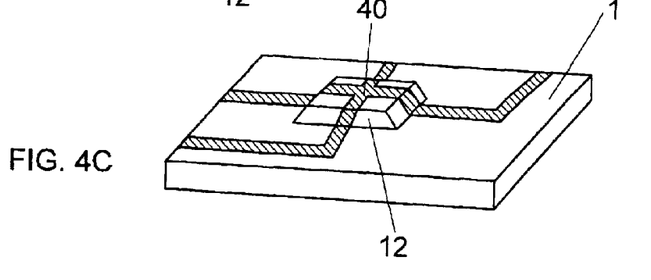

If necessary, a plurality of conductive layers 40 may be formed on a single projection 12, as shown in FIGS. 4A to 4C. In this case, it is possible to increase a degree of flexibility in circuit design by reducing a total number of projections to be formed on the substrate 1. Therefore, these are particularly effective to manufacture a high-density printed wiring board. In addition, there is an advantage that the conductive layers can be efficiently removed after the electroplating.

In place of the substrate 1 with the projections (12, 22) formed by integral molding, those projections may be formed at required positions on a substrate by means of secondary molding. When the projection is made from a resin material different from the substrate material, the projection having the conductive layer thereon can be easily removed from the substrate by use of a tool and so on. In this case, the electrical insulation between the circuit patterns can be provided with reliability. In addition, since the occurrence of residual flash and chips of the resin material is prevented, there is an advantage of simplifying a subsequent cleaning step. As the secondary molding, for example, it is preferred to use a dispense system for supplying a resin from a needle nozzle by air pressure, or an ink-jet system for spraying the resin at a required area.

As another method of removing the projection formed by the secondary molding from the substrate, it is possible to give shocks or vibrations to the projection, or blast a fluid such as water or air on the projection under high speed and high pressure. In addition, when the projection is made from a resin material having a coefficient of thermal expansion much different from the substrate material, it is possible to peel off the projection with the conductive layer from the substrate by alternately blowing hot and cold airs on the projection. To facilitate the easiness of peeling off the projection from the substrate, it is preferred to provide a layer of a release agent such as polyethylene, silicone resin or the like between the substrate and the projection.

Figure 5A:
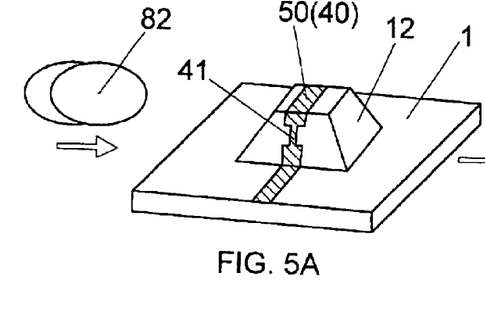
FIGS. 5A and 5B are schematic perspective views showing a step of cutting the projection having the conductive layer at notches.
Figure 5B:
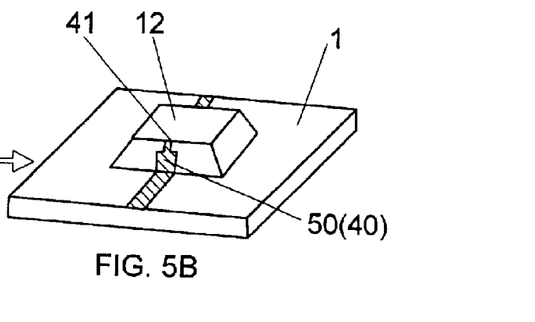
Figure 6A:
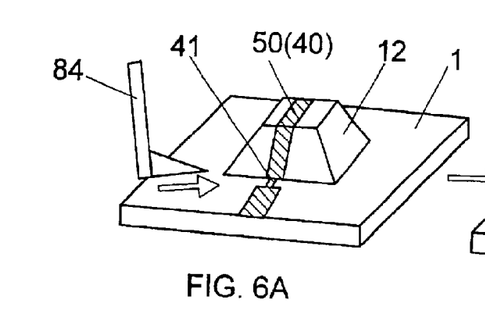
FIGS. 6A and 6B are schematic perspective views showing a step of peeling off the projection having the conductive layer from the substrate.
Figure 6B:
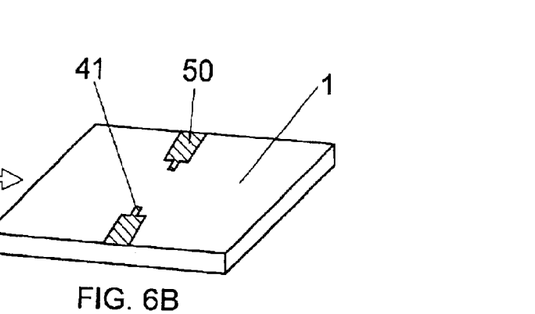
Figures 7A, 7B:
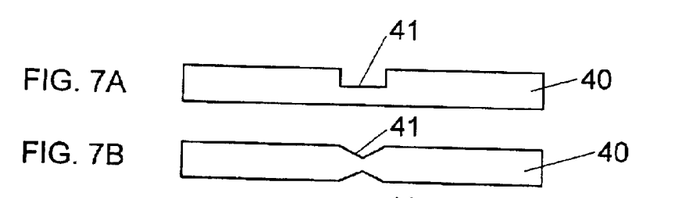
FIGS. 7A to 7G show a variety of notch shapes formed in the conductive layer.
Figure 7C:
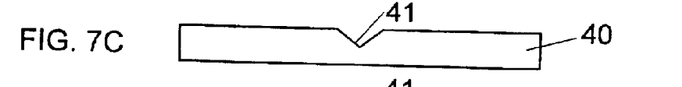
Figure 7D:
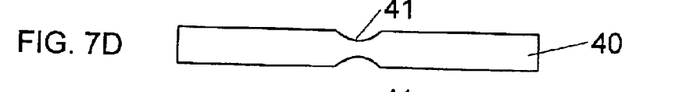
Figure 7E:
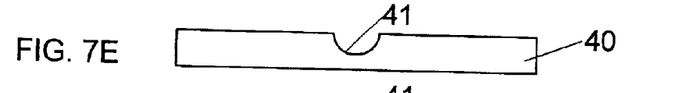
Figure 7F:
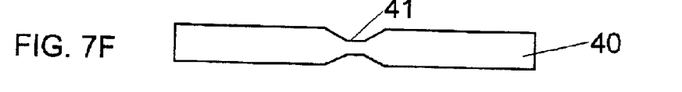
Figure 7G:
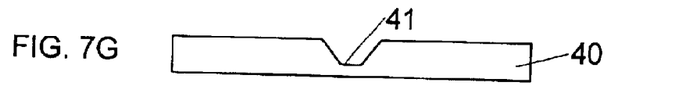

As a modification of the present embodiment, it is preferred to form notches at required positions of the conductive layer to improve the easiness of removing the conductive layer by cutting or grinding, and minimize the occurrence of residual flash at the cutting sections. For example, when the conductive layer 40 extends through opposite side walls and the top of the projection 12 in a straight direction, as shown in FIG. 5A, it is preferred to form a narrow width region 41 of the conductive layer on each of the side walls of the projection 12. In this case, as shown in FIG. 5B, an upper portion of the projection 12 with the conductive layer 40 is cut horizontally at a height of the narrow-width region 41 of the conductive layer by a grinding wheel 82. Alternatively, narrow-width regions 41 may be formed in the conductive layer 40 on the substrate 1 at the opposite sides of the projections 12, as shown in FIG. 6A. In this case, by peeling off the projection 12 with the conductive layer 40 from the substrate 1 with use of a tool 84, as shown in FIG. 6B, the conductive layer 40 can be easily cut at the narrow-width regions 41. Another notch shapes preferable in the present invention are also shown in FIGS. 7A to 7G.

Figure 8A:
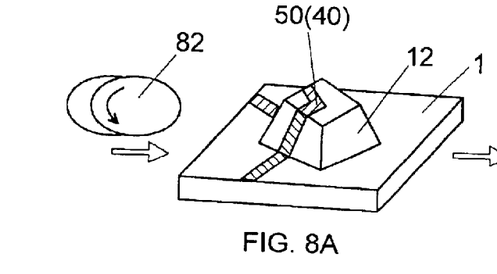
FIGS. 8A and 8B are perspective views showing a modification of the step of cutting the projection having the conductive layer.
Figure 8B:
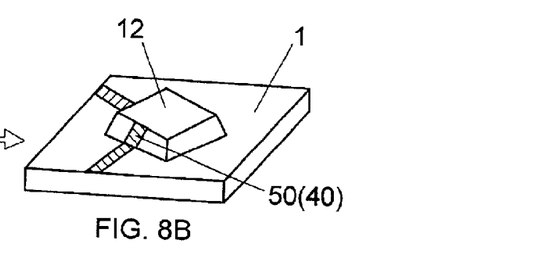
Figure 9A:
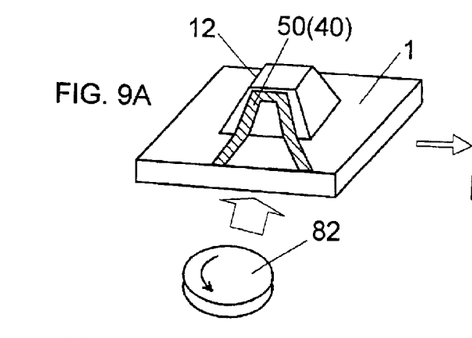
FIGS. 9A and 9B are perspective views showing another modification of the step of cutting the projection having the conductive layer.
Figure 9B:
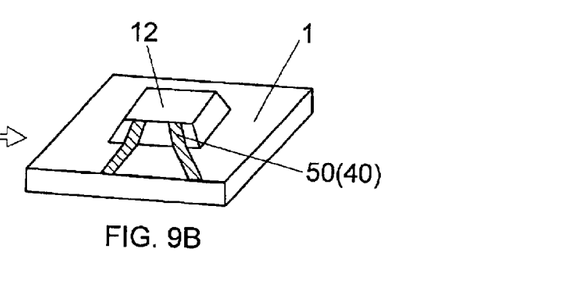

In the step of cutting the projection with the conductive layer, to prevent the occurrence of residual flash or peeling at the cutting sections, it is preferred to remove the first conductive layer together with a part of the projection by allowing a cutting or grinding tool to cut into a side surface having the first conductive layer of the projection such that an edge of the cutting or grinding tool presses the first conductive layer against the side surface of the projection, and allowing the cutting or grinding tool to pass through the projection in a direction from the side surface having the first conductive layer of the projection to another side surface not having the first conductive layer of the projection. For example, when the conductive layer 40 is formed on adjacent side walls of the projection 12 by changing the direction of the conductive layer at a required angle ($\theta$) on the top of the projection, as shown in FIG. 8A, it is preferred to cut the projection 12 by allowing the grinding wheel 82 to pass through the projection in a direction from an edge between the adjacent side walls having the conductive layers to an opposite edge between adjacent side walls not having the conductive layers, to thereby provide electrical insulation between the circuit patterns, as shown in FIG. 8B. Alternatively, when the conductive layer 40 is formed on a side surface of the projection 12 in a U-turn manner without the formation of the conductive layer on the top of the projection, as shown in FIG. 9A, it is preferred to cut the projection by allowing the grinding wheel 82 to pass through the projection from the side wall with the conductive layer to the opposite side wall with no conductive layer, to thereby provide electrical insulation between the circuit patterns, as shown in FIG. 9B.

Figure 10A:
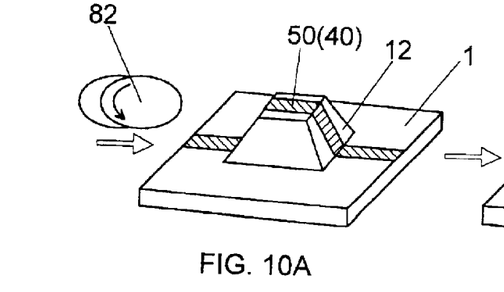
FIGS. 10A and 10B are perspective views showing another modification of the step of cutting the projection having the conductive layer.
Figure 10B:
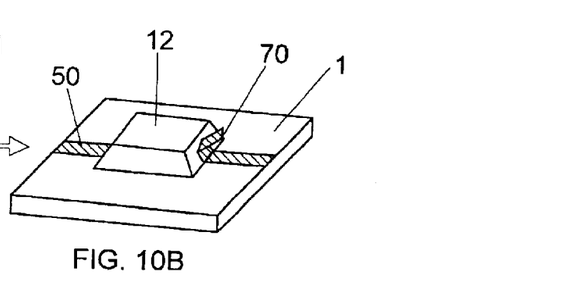
Figure 11A:
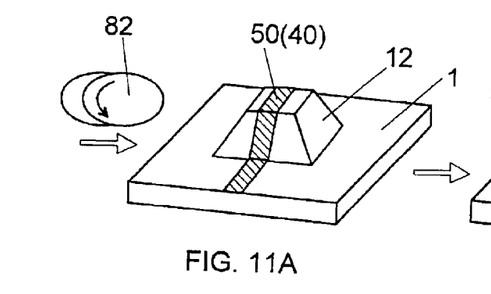
FIGS. 11A and 11B are perspective views showing another modification of the step of cutting the projection having the conductive layer.
Figure 11B:
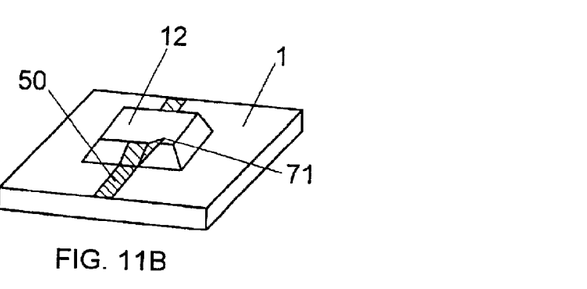

On the other hand, when the upper portion of the projection 12 is cut by allowing the grinding wheel 82 to pass through the projection in a direction substantially equal to the direction of the conductive layer 40, as shown in FIG. 10A, there is a fear that peeling 70 of the conductive layer 40 occurs at a side surface of the projection from which the grinding wheel 82 comes out, as shown in FIG. 10B. In addition, when the upper portion of the projection 12 is cut by allowing the grinding wheel 82 to pass through the projection in a direction substantially rectangular to the direction of the conductive layer, as shown in FIG. 11A, there is a fear that residual flash 71 of the conductive layer left on the projection occurs at the cutting section, as shown in FIG. 11B.

In the case of FIG. 8A, an angle ($\theta$) between the traveling direction of the grinding wheel 82 and the direction of the conductive layer 40 is approximately 45°. To effectively prevent the occurrence of the residual flash and peeling at the cutting sections, it is preferred that the angle ($\theta$) is within a range of $0<(\theta)\leqq80°$, and more preferably $0<(\theta)\leqq60°$. In the case of FIG. 9A, the traveling direction of the grinding wheel 82 is substantially equal to the direction of the conductive layer 40. However, since the conductive layer 40 having the U-turn shape is formed on the side surface of the projection 12, and no conductive layer is formed on the opposite side surface of the projection from which the grinding wheel 82 comes out, there is no worry about the occurrence of peeling 70 of the conductive layer 40 left on the projection.

Second Embodiment

Figure 12A:
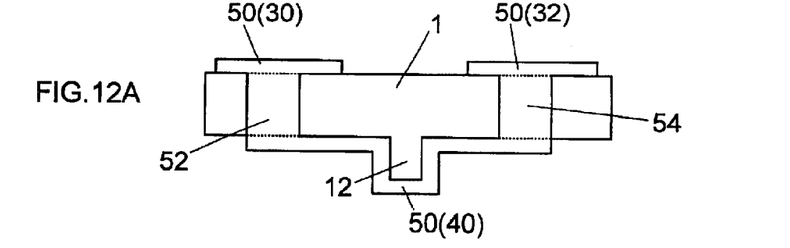
FIGS. 12A and 12B are schematic cross-sectional views showing a method of manufacturing a printed wiring board according to a second embodiment of the present invention.

In this embodiment, as shown in FIG. 12A, a top surface of the substrate 1 is used to form first and second circuit patterns (30, 32) isolated from each other. The substrate 1 has a projection 12 on its bottom surface. In addition, a conductive layer 40 is formed on the bottom surface of the substrate 1 through the projection 12. The first circuit pattern 30 is electrically connected to the conductive layer 40 on the bottom surface of the substrate by a conductive pin 52 passing through the substrate 1. Similarly, the second circuit pattern 32 is electrically connected to the conductive layer 40 on the bottom surface of the substrate by a conductive pin 54 passing through the substrate 1. Therefore, by use of the conductive pins (52, 54) and the conductive layer 40 extending between the pins through the projection 12, a temporary electrical connection between the first circuit pattern 30 and the second circuit pattern 32 is obtained. In place of the conductive pin, a plated through-hole may be used.

Figure 12B:
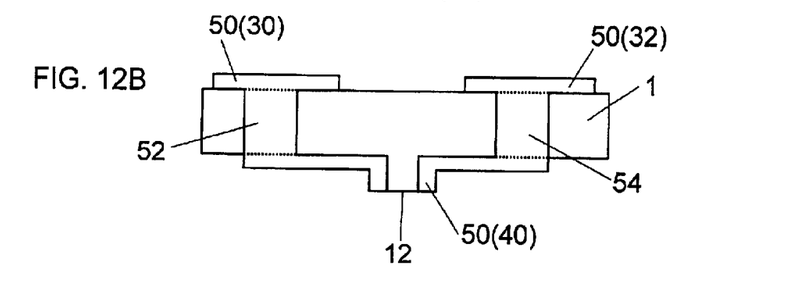

Subsequently, electroplating such as copper electroplating is performed by the passage of electric current through the first and second circuit patterns (30, 32) connected by the conductive pins (52, 54) and the conductive layer 40 to simultaneously form an additional metal (copper) film (not shown) having a desired thickness on these circuit patterns on the top of the substrate 1. After the electroplating, the conductive layer 40 on the projection 12 is removed to provide electrical insulation between the first and second circuit patterns (30, 32), as shown in FIG. 12B.

In this case, since the circuit patterns (30, 32) can be designed on the top surface of the substrate 1 without consideration of a space required to form the projection 12, a degree of flexibility in circuit design can be remarkably improved. Therefore, this embodiment is particularly effective to form high density circuit patterns. In addition, there is an advantage that an operation of mounting electronic parts on the top surface of the substrate 1 is not hindered by the presence of projection 12. Moreover, in the step of mechanically removing the conductive layer 40 on the projection 12 on the bottom surface of the substrate 1 by use of cutting tool such as the grinding wheel 82, it is possible to minimize the occurrence of damages to the circuit patterns (30, 32) on the top surface of the substrate 1. This presents an improvement in production yields.

Third Embodiment

Figures 13A, 13B, 14A:
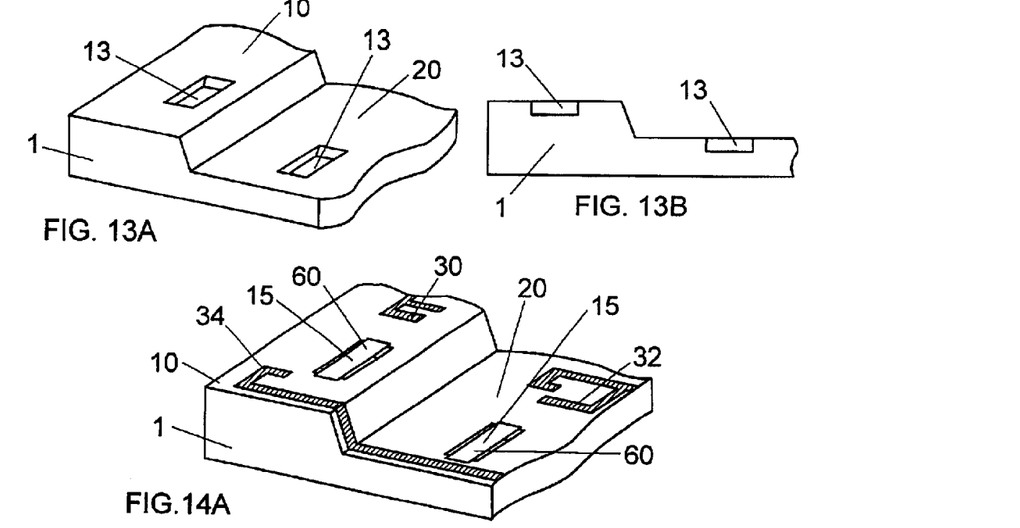
FIGS. 13A and 13B are schematic perspective and cross-sectional views of a substrate used in a method of manufacturing a printed wiring board according to a third embodiment of the present invention.
FIGS. 14A to 14D are schematic perspective views showing the method according to the third embodiment of the present invention.
Figure 15:
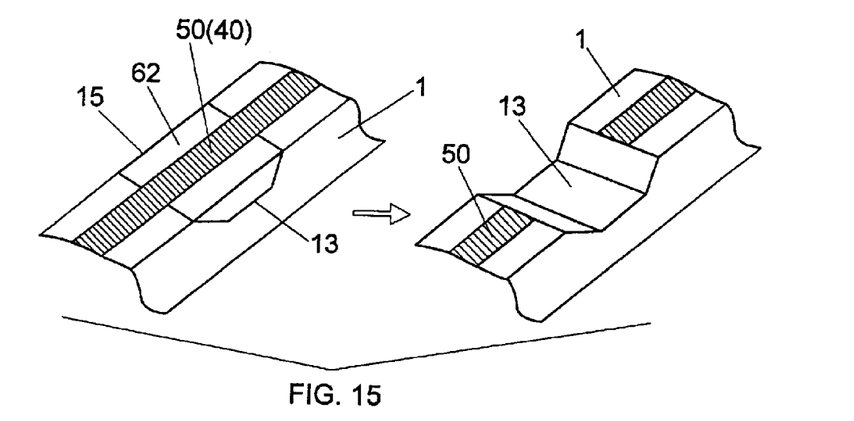
FIG. 15 shows a modification of the step of removing the conductive layer in the method of the third embodiment.

As shown in FIGS. 13A and 13B, a substrate 1 used in the third embodiment has a concave 13 in its top surface. It is preferred that the concave 13 is integrally formed with the substrate 1 by means of injection molding. As in the case of the first embodiment, the substrate 1 is provided with a first surface 10, a second surface 20, and an oblique surface extending between the first and second surfaces. Therefore, the second surface 20 extends at a different level from the first surface 10. The concave 13 is covered with a material different from the substrate 1 to obtain a cover portion 15, as shown in FIG. 14A. For example, the cover portion 15 can be obtained by building a bridge over the concave 13 with use of a film of 60 an electrical insulating material. Alternatively, the cover portion 15 may be formed by filling an electrical insulating material 62 in the concave 13 such that a top surface of the cover portion is substantially flush with the top surface of the substrate around the cover portion, as shown in FIG. 15.

Figure 14B:
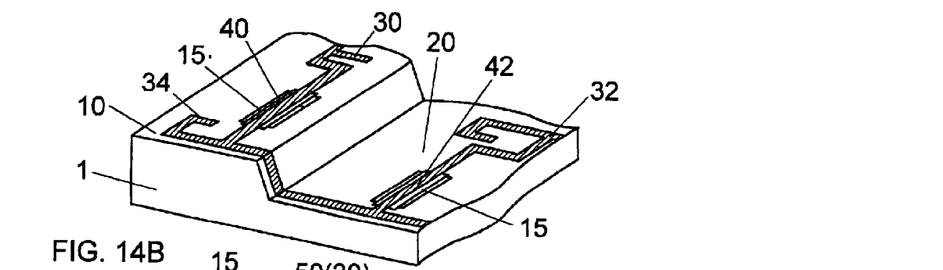

In addition, on the top surface of the substrate 1, first, second and third circuit patterns (30, 32, 34) isolated from each other are formed, as shown in FIG. 14A. As shown in FIG. 14B, conductive layers 40, 42 are formed on the cover portions 15 to make temporary electrical connections between the first and third circuit patterns (30, 34) and between the second and third circuit patterns (32, 34), respectively. The conductive layers 40, 42 are used only in the step of electroplating described below.

Figure 14C:
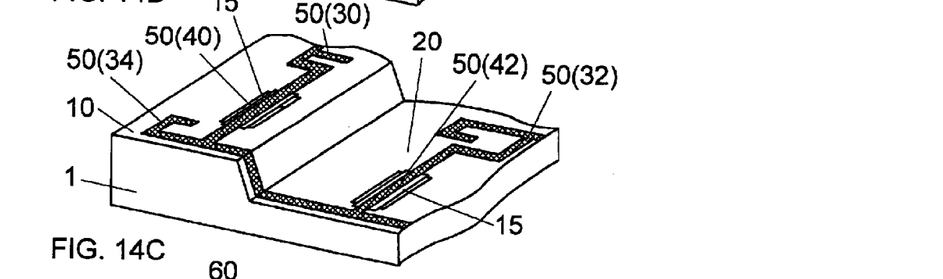
Figure 14D:
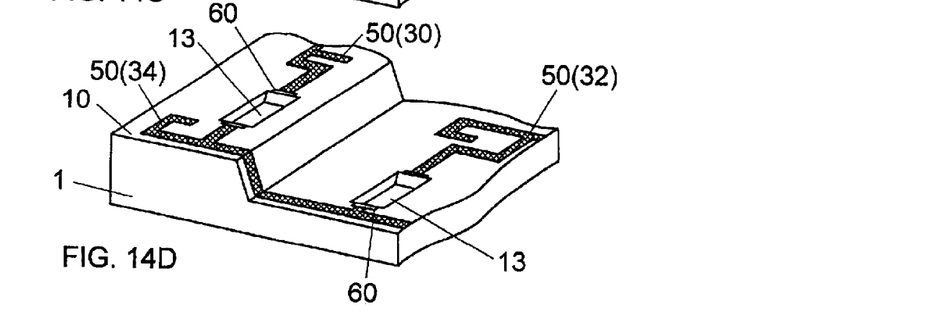

Next, as shown in FIG. 14C, electroplating such as copper electroplating is performed by the passage of electric current through the first, second and third circuit patterns (30, 32, 34) connected by the conductive layers 40, 42 to simultaneously form an additional metal film 50 on those circuit patterns. For example, when the electric current is supplied to the third circuit pattern 34, it flows to the first circuit pattern 30 through the conductive layer 40 on the cover portion 15, and at the same time flows to the second circuit pattern 32 through the conductive layer 42 on the cover portion 15. As described above, by removing the conductive layers 40, 42 on the cover portions 15 after the electroplating, the electrical insulation among the first, second and third circuit patterns (30, 32, 34) with the additional metal film 50 is obtained. In FIG. 14D, the insulation films 60 having the conductive layers (40, 42) are removed from the concaves 13.

Figure 16:
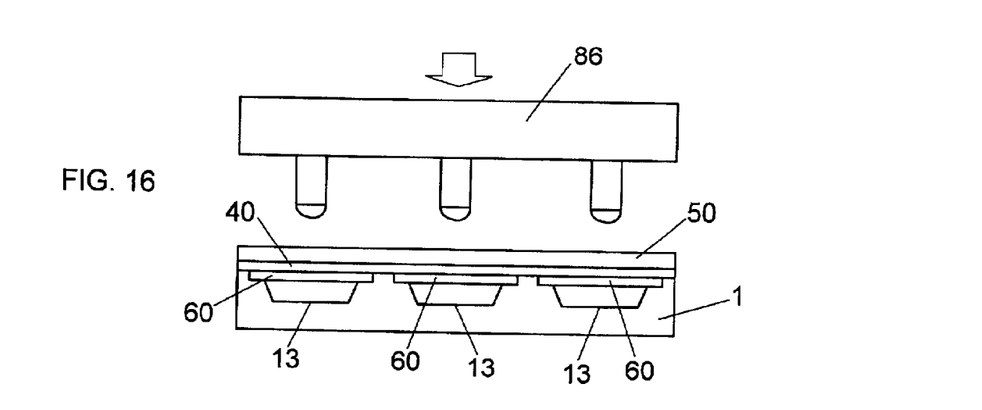
FIG. 16 is a cross-sectional view showing a further modification of the step of removing the conductive layer in the method of the third embodiment.

To remove the conductive layers 40, 42, for example, it is possible to use grinding or cutting. In this case, it is preferred to remove the conductive layer (40, 42) together with at least a part of the cover portion 15 from the substrate 1. There is an advantage of preventing short circuit resulting from a residue of the conductive layer (40, 42) on the cover portion 15 with reliability. Alternatively, the conductive layer (40, 42) may be removed together with the part of the cover portion by drilling. In the case of forming the cover portion 15 with use of the electrically insulating film 60, as shown in FIG. 14A, since there is an air space under the insulation film 60 in the concave 13, it is possible to easily provide the electrical insulation between the circuit patterns by punching the conductive layer 40 on the insulation film 60 with use of a punching machine 86, as shown in FIG. 16. In addition, when simultaneously punching a plurality of the conductive layers (40, 42) with the punching machine 86, it is possible to efficiently obtain the electrical insulation among the circuit patterns.

In the above method, to improve manufacturing efficiency, it is particularly preferred that the formation of the first, second and third circuit patterns (30, 32, 34) and the formation of the conductive layers (40, 42) are performed at a time. That is, after the concave 13 is covered with a material different from the substrate 1 to obtain a cover portion 15, a metal thin film is formed on the substrate 1. Then, an initial circuit pattern is formed on the substrate by patterning the metal thin film. The initial circuit pattern comprises the first, second and the third circuit patterns (30, 32, 34) isolated from each other, and the conductive layers (40, 42) formed on the cover portions 15 to make temporary electrical connections between the first and third circuit patterns (30, 34) and between the second and third circuit patterns (32, 34), respectively. Subsequently, electroplating is performed by the passage of electric current through the initial circuit pattern to form an additional metal film 50 on the initial circuit pattern. After the electroplating, the conductive layers (40, 42) on the cover portions 15 are removed to provide electrical insulation among the first, second and third circuit patterns (30, 32, 34) with the additional metal films 50. As the patterning method, it is preferred that required regions of the metal thin film are removed by irradiating a laser beam along a predetermined pattern. According to this method, it is possible to efficiently form a high-density pattern of the metal thin film with accuracy.

If necessary, a plurality of conductive layers may be formed on a single cover portion. In this case, it is possible to increase a degree of flexibility in circuit design by reducing a total number of concaves to be formed in the substrate. In addition, there is an advantage of efficiently performing the step of removing the conductive layers after the electroplating.

Figure 17:
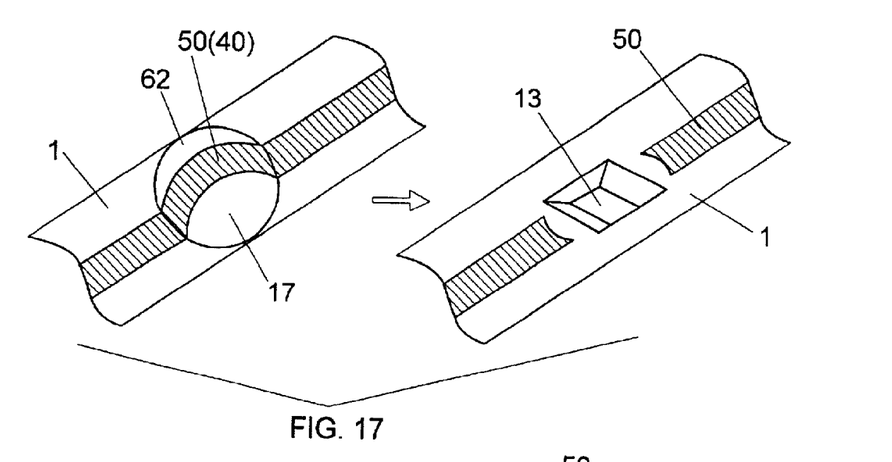
FIG. 17 shows a step of peeling off a cover portion with a conductive layer from a concave in the method of the third embodiment.

As a modification of the present embodiment, as shown in FIG. 17, the cover portion 15 may be formed by use of an electrical insulating resin 62 such that a dome-like projection 17 of the insulating resin is formed above the concave 13, and an air space in the concave is maintained under the dome-like projection 17. The conductive layer 40 is formed on the dome-like projection 17. Due to a reduced contact area between the dome-like projection 17 and the substrate 1, the dome-like projection 17 with the conductive layer 40 can be easily peeled off from the substrate 1 by applying a small external force to the dome-like projection.

Figure 18:
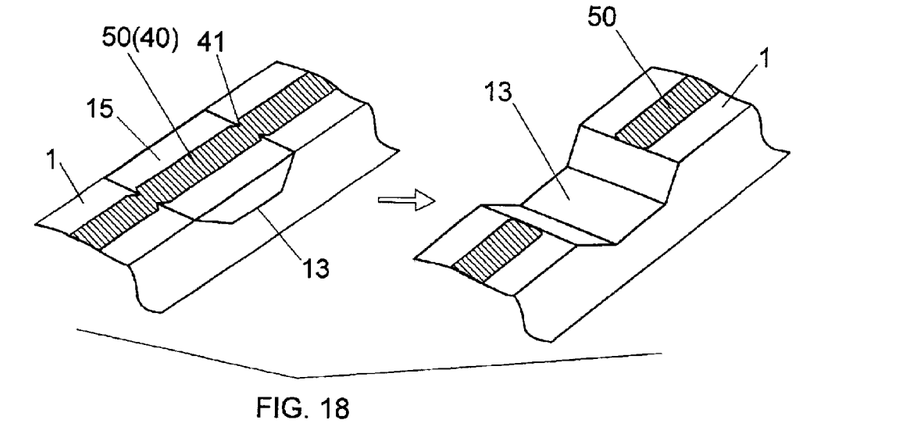
FIG. 18 shows a step of removing a conductive layer with notches from a concave in the method of the third embodiment.

In addition, as shown in FIG. 18, it is preferred that the conductive layer 40 extending on the cover portion 15 has notches 41 at opposite ends of the cover portion in a direction of the conductive layer. In this case, a region of the conductive layer 40 between the notches 41 is removed to provide electrical insulation between the first and second circuit patterns. The formation of these notches 41 is effective to prevent the occurrence of residual flash or peeling of the conductive layer 40 left on the substrate 1.

Figure 19:
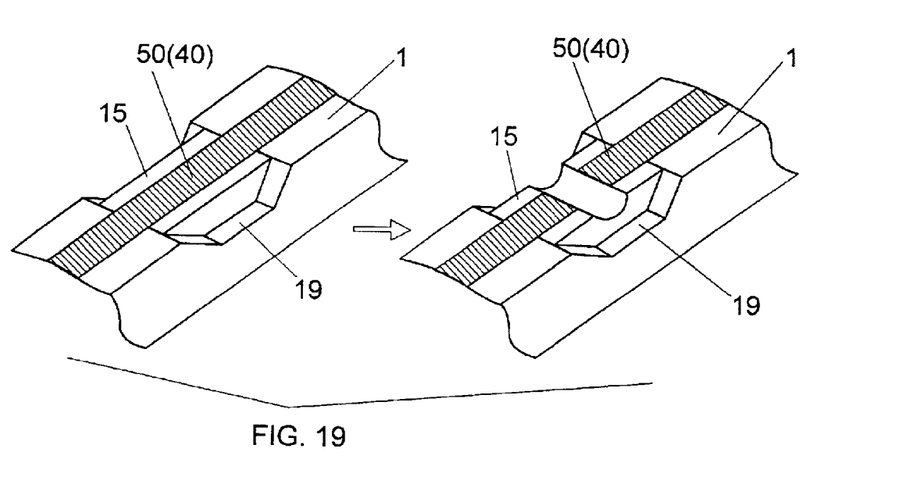
FIG. 19 shows a modification of the step of removing the conductive layer in the method of the third embodiment.

In the case of forming the cover portion 15 by filling the electrical insulating material 62 in the concave 13, it is preferred to leave air spaces 19 at the opposite sides of the cover portion 15 in the concave 13, as shown in FIG. 19. A used amount of the electrical insulating material 62 can be saved. For example, by removing the conductive layer 40 with a part of the cover portion 15 by use of a cutting tool, the electrical insulation between the circuit patterns is provided. Alternatively, the cover portion 15 with the conductive layer may be peeled off from the concave 13 by use of a tool inserted into the air space(s) 19.

In the case of requiring a plurality of cover portions, the cover portions may be formed by means of secondary molding. In this case, it is possible to fill the electrical insulation material in required concaves at a time. As the secondary molding, for example, it is preferred to use a dispense system for supplying a resin from a needle nozzle by air pressure, or an ink-jet system for spraying the resin at a required area. When the cover portion is formed by use of a resin material different from the substrate material, the cover portion with the conductive layer can be easily peeled off from the concave by use of a tool and so on. When the cover portion has a hook to which a tool can be readily engaged, the step of peeling off the cover portion from the concave is further facilitated. In addition, since the occurrence of residual flash and chips of the resin material is prevented, there is an advantage of simplifying a subsequent cleaning step.

In the case of peeling off the cover portion with the conductive layer from the concave of the substrate, for example, it is preferred to give shocks or vibrations to the cover portion, or blast a fluid such as water or air on the cover portion under high speed and high pressure. In addition, when the cover portion is formed by filling a resin material having a coefficient of thermal expansion much different from the substrate material in the concave, it is possible to peel off the cover portion from the concave by alternately blowing hot and cold airs on the cover portion. In this case, there is an advantage of preventing the occurrence of residual flash or peeling of the conductive layer left on the substrate. Moreover, to facilitate the easiness of peeling off the cover portion from the substrate, it is preferred to form the cover portion after providing a layer of a release agent such as polyethylene, silicone resin or the like in the concave.

What is claimed is:

1. A method of producing a printed wiring board comprising the steps of:
    providing a substrate with at least one of a projection and a concave;
    forming a first circuit pattern on said substrate;
    forming a second circuit pattern isolated from the first circuit pattern on said substrate;
    wherein when said substrate has the projection, the method comprises the steps of:
        forming a first conductive layer on the projection to make a temporary electrical connection between the first and second circuit patterns;
        performing electroplating by the passage of electric current through the first and second circuit patterns connected by the first conductive layer to simultaneously form a metal film on the first and second circuit patterns; and
        after the electroplating, removing the first conductive layer on the projection to provide electrical insulation between the first and second circuit patterns;
    wherein when said substrate has the concave, the method comprises the steps of:
        covering the concave with a material different from said substrate to obtain a cover portion;
        forming a second conductive layer on said cover portion to make a temporary electrical connection between the first and second circuit patterns;
        performing electroplating by the passage of electric current through the first and second circuit patterns connected by the second conductive layer to simultaneously form a metal film on the first and second circuit patterns; and
        after the electroplating, removing the second conductive layer on said cover portion to provide electrical insulation between the first and second circuit patterns.

2. The method as set forth in claim 1, wherein said substrate with at least one of the projection and the concave is formed by means of integral molding.

3. The method as Set forth in claim 1, wherein said substrate has a plurality of projections, which are formed such that top of the projections are substantially flush with each other.

4. The method as set forth in claim 1, wherein the first circuit pattern, the second circuit pattern and the first conductive layer are provided at a time by patterning a metal thin film formed on said substrate.

5. The method as set forth in claim 1, wherein the first circuit pattern, the second circuit pattern and the second conductive layer are provided at a time by patterning a metal thin film formed on said substrate after the concave is covered with said material.

6. The method as set forth in claim 1, wherein the first conductive layer is removed together with at least a part of the projection from said substrate to provide electrical insulation between the first and second circuit patterns.

7. The method as set forth in claim 1, wherein said cover portion is obtained by building a bridge over the concave with use of a film of an electrical insulating material.

8. The method as set forth in claim 1, wherein said cover portion is formed by filling an electrical insulating material in the concave such that a top surface of said cover portion is substantially flush with the top surface of said substrate around said cover portion.

9. The method as set forth in claim 1, wherein the second conductive layer is removed together with at least a part of said cover portion from the concave to provide electrical insulation between the first and second circuit patterns.

10. The method as set forth in claim 1, wherein the second conductive layer has notches at opposite ends of said cover portion in a direction of the second conductive layer, and the second conductive layer between said notches is removed to provide electrical insulation between the first and second circuit patterns.

11. The method as set forth in claim 1, wherein the first and second circuit patterns are formed on a surface opposed to the projection of said substrate, and the first circuit pattern is electrically connected to the second circuit pattern through electrical conductive members passing through said substrate and the first conductive layer on the projection.

12. The method as set forth in claim 1, wherein the first conductive layer is removed together with a part of the projection by allowing a cutting or grinding tool to cut into a side surface having the first conductive layer of the projection such that an edge of the cutting or grinding tool presses the first conductive layer against the side surface of the projection, and allowing the cutting or grinding tool to pass through the projection in a direction from the side surface having the first conductive layer of the projection to another side surface not having the first conductive layer of the projection.

13. A method of manufacturing a printed circuit board comprising:

forming a metal thin film on a substrate having a projection;

providing an initial circuit pattern on said substrate by patterning the metal thin film, said initial circuit pattern comprising first and second circuit patterns isolated from each other and a conductive layer formed on the projection to make a temporary electrical connection between the first and second circuit patterns;

performing electroplating by the passage of electric current through the initial circuit pattern to form an additional metal film on the initial circuit pattern; and after the electroplating, removing the conductive layer on the projection to provide electrical insulation between the first and second circuit patterns.

14. A method of producing a printed wiring board comprising the steps of:

providing a substrate with a first surface having a first projection and a second surface extending at a different level from the first surface and having a second projection thereon;

forming a first circuit pattern on the first surface;

forming a second circuit pattern isolated from the first circuit pattern on the second surface;

forming a third circuit pattern isolated from the first and second circuit patterns so as to extend from the first surface to the second surface;

forming a first conductive layer on the first projection to make a temporary electrical connection between the first and third circuit patterns;

forming a second conductive layer on the second projection to make a temporary electrical connection between the second and third circuit patterns;

performing electroplating by the passage of electric current through the first, second and third circuit patterns connected by the first and second conductive layers to simultaneously form a metal film on the first, second and third circuit patterns; and after the electroplating, removing the first and second conductive layers on the first and second projections to provide electrical insulation among the first, second and third circuit patterns.

15. The method as set forth in claim 14, wherein the first and second projections are formed such that a top of the first projection is substantially flush with the top of the second projection, and wherein the first and second conductive layers on the first and second projections are removed at a time.

16. The method as set forth in claim 15, wherein the first and second conductive layers on the first and second projections are removed at the same time by means of chemical etching.

17. The method as set forth in claim 14, wherein the first circuit pattern, the second circuit pattern, the third circuit pattern and the conductive layer are provided at a time by patterning a metal thin film formed on said substrate.

* * * * *